United States Patent
Drewery (10) Patent No.: US 6,774,039 B1
(45) Date of Patent: Aug. 10, 2004

(54) PROCESS SCHEME FOR IMPROVING ELECTROPLATING PERFORMANCE IN INTEGRATED CIRCUIT MANUFACTURE

(75) Inventor: John S. Drewery, Alameda, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/215,156

(22) Filed: Aug. 8, 2002

(51) Int. Cl.$^7$ ............................................. H01L 21/44
(52) U.S. Cl. ........................ 438/687; 438/627; 438/633; 438/637; 438/685
(58) Field of Search ...................... 438/630, 627–629, 438/637–640, 642–644, 685–688, 666–668, 675, 678

(56) References Cited

U.S. PATENT DOCUMENTS

| | | | |
|---|---|---|---|
| 6,100,194 A | * | 8/2000 | Chan et al. ................ 438/686 |
| 6,265,295 B1 | * | 7/2001 | Lin et al. .................... 438/586 |
| 6,281,095 B1 | * | 8/2001 | Bolam et al. ............... 438/462 |
| 6,495,918 B1 | * | 12/2002 | Brintzinger ................. 257/758 |

* cited by examiner

Primary Examiner—Jack Chen
Assistant Examiner—Thanh Nguyen
(74) Attorney, Agent, or Firm—MacPherson Kwok Chen & Heid LLP; Tom Chen (57) ABSTRACT

Copper bus bars are formed between adjacent die on a wafer during the process flow. The bus bars are between 50 and 100 μm wide and between 2 and 5 μm deep. A barrier layer is formed between the bus bars and the die to prevent copper diffusion. A dielectric layer is deposited over the bus bars and die and etched with contacts and features, such as vias. A seed layer is subsequently deposited over the wafer, which allows electrical conductance between the bus bars and the die during a subsequent electroplating process to fill the features and contacts. The bus bars carry electroplating current from the die edge to the die center. As a result, current does not need to be carried by a low sheet resistivity seed layer from the wafer edge to the center. This allows the seed layer to be thinner and of materials other than copper. Further, thinner seed layers allow thicker barrier layer for more reliability.

27 Claims, 7 Drawing Sheets

PROCESS SCHEME FOR IMPROVING ELECTROPLATING PERFORMANCE IN INTEGRATED CIRCUIT MANUFACTURE

BACKGROUND OF THE INVENTION

1. Field of the Invention

The present invention relates to semiconductor devices and processing, and in particular, to electroplating and fabrication of layers prior to electroplating.

2. Discussion of the Related Art

Integrated circuits fabricated on semiconductor substrates for very and ultra large scale integration typically require multiple levels of metal layers to electrically interconnect the discrete layers of semiconductor devices on the semiconductor chips. The different levels of metal layers are separated by various insulating or dielectric layers (also known as interlevel dielectric (ILD) layers), which have etched via holes to connect devices or active regions from one layer of metal to the next.

As semiconductor technology advances, circuit elements and dimensions on wafers or silicon substrates are becoming increasingly more dense. Consequently, the interconnections between various circuit elements and dielectric layers needs to be as small as possible. One way to reduce the size of interconnection lines and vias is to use copper (Cu) as the interconnect material instead of conventionally used materials such as aluminum (Al). Because copper has lower resistivities and significantly higher electromigration resistance as compared to aluminum, copper advantageously enables higher current densities experienced at high levels of integration and increased device speed at higher frequencies. Thus, major integrated circuit manufacturers are transitioning from aluminum-based metallization technology to dual damascene copper technology.

However, the use of copper as the interconnect material presents various problems. For example, there is currently no production-worthy dry etch process for Cu. This necessitates the use of a dual damascene "inlaid" approach. In the dual damascene approach, a dielectric or insulating diffusion barrier layer is deposited over a copper layer. The dielectric layer is then patterned, e.g., by conventional masking and etching techniques, to form a two-step connection having a narrower lower portion (or via portion) exposing desired connection areas on the underlying patterned metal layer and a wider upper portion (or trench portion) that will form the next layer of metal lines. Copper is then deposited to fill the via and trench, such as by electroplating. Excess copper is then removed, e.g., by a chemical mechanical polish (CMP) process. The resulting structure is a via (the filled via portion) connecting the desired areas in the underlying metal layer with an overlying copper line (the filled trench portion).

One of the consequences of using copper is that copper atoms can readily diffuse into adjacent ILD or other dielectric layers, which can compromise their integrity as insulators or cause voids in the conductors because of out-diffusion of the copper. As a result, a diffusion barrier layer is typically formed over the trenches and vias prior to forming the copper layer. Materials for the barrier layer include Tantalum (Ta), Tungsten Nitride (WN), Titanium Nitride (TiN), Tantalum Nitride (TaN), Silicon Nitride (SiN), and Tungsten (W). The barrier layer may be conformally deposited using a conventional chemical vapor deposition (CVD) process, physical vapor deposition (PVD) process or other known deposition process.

This technique relies on electroplating to fill small features (of order 100 nm in width) with copper. In order for this to work, a "seed layer" must be applied to the wafer to provide enough electrical conductance across the wafer, so that a sufficiently uniform layer can be electroplated. In order to electroplate copper, the underlying surface has to be able to conduct current across its surface since electroplating is an electrochemical process. The diffusion barrier typically has high sheet resistivity. Because current must flow through this layer to reach the center portions of the wafer, the voltage drop between the wafer center and its edge may be excessive. Thus, a highly conductive seed layer, typically copper, is deposited over the diffusion barrier. Deposition can be performed by any suitable process, such as PVD.

A key property of the seed layer is that it should have a low sheet resistance per square. Processes in the field at present require less than 1 ohm per square seed resistance, although with improvements in electroplating technology, films as resistive as 5 ohms per square may eventually be suitable seeds. The approximate thickness of films needed to achieve this sheet resistance is shown for various metals in Table 1 below.

TABLE 1

| Metal | Thickness for 5 ohm/sq | Thickness for 10 ohm/sq | Thickness for 20 ohm/sq |
| --- | --- | --- | --- |
| Cu (2 $\mu\Omega$cm) | 4 nm | 2 nm | 1 nm |
| W (CVD) (16 $\mu\Omega$cm) | 32 nm | 16 nm | 8 nm |
| Co (CVD) (11 $\mu\Omega$cm) | 22 nm | 11 nm | 5.5 nm |
| TiN (ALD) (170 $\mu\Omega$cm) | 340 nm | 170 nm | 85 nm |

These calculations are based on the bulk conductivity of the metals listed. In practice, a larger thickness is needed. The thin film material used does not achieve bulk conductivity, and electron scattering effects also decrease the effective conductivity of such thin films. One problem with depositing a thin copper seed layer is that they do not generally coat the barrier layer in a uniform manner. Rather, voids or non-continuous seed layer regions on the sidewalls are often present, thereby resulting in the inability to properly apply a subsequent electrochemically deposited copper layer. When a discontinuity is present in the seed layer, the portion of the seed layer that is not electrically connected to the bias power supply does not receive deposition during the electroplating process. This is particularly prevalent with high aspect ratio, sub-micron features, where the bottom surface of these features are especially difficult to fill using PVD.

Further, thin seed layers tend to include spikes that impact the uniformity of the subsequent electrolytically deposited metal layer. Such spikes result in high potential regions at which the copper deposits at a higher rate than at other, more level regions. During the electroplating, the voltage and current near the perimeter of the wafer tends to be substantially higher than the voltage and current near the central portions of the wafer. Consequently, copper plates onto the surface of the wafer much more rapidly towards the edges of the wafer, resulting in thicker copper layers towards the perimeter of the wafer. A thicker seed layer can offset this characteristic. Moreover, as shown by Broadbent et al., J. Vac. Sci. Technol., B 17(6), p. 2584 (1999), which is incorporated by reference, the features etched into the dielectric that are coated with the seed layer increase the effective sheet resistance, so that a still thicker seed layer is called for.

Figure 1A:
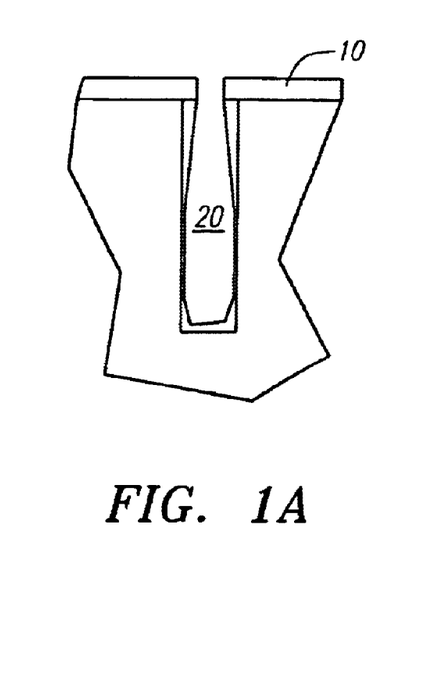
FIG. 1A is a cross-sectional view of a portion of a semiconductor device with a feature, in which a seed layer has been deposited by PVD.

However, there is a limit to the combined barrier and seed layer thickness that can be deposited inside features while still allowing for filling of the feature by electroplating. The limit arises because there is a maximum aspect ratio of a feature that can be successfully filled by electroplating. Until now, PVD has been used to deposit the seed layers. As shown in FIG. 1A, PVD forms a seed layer 10 having a much thicker layer on the planar surface ("field") of the wafer than within the small features such as vias 20 and trenches. The thicker material in the field allows current to be conducted across the wafer, while there is sufficient copper in the features to allow electroplating in the features. With lower aspect ratio features, e.g., <3:1, the opening of feature stays open long enough to allow a void-free fill with the electroplating.

Figure 1B:
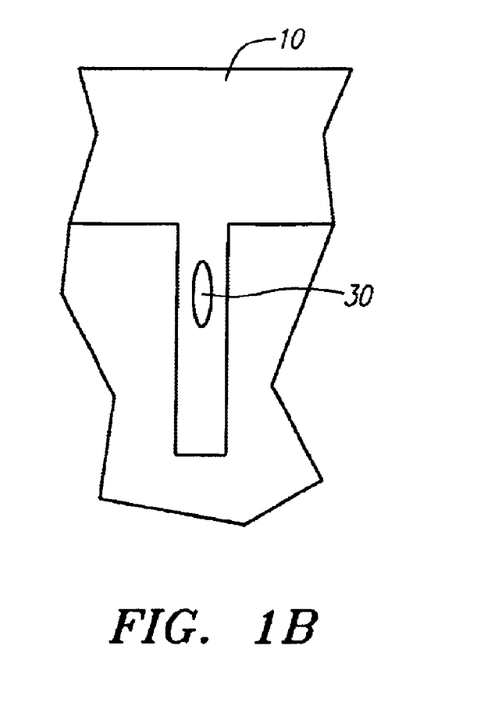
FIG. 1B is a cross-sectional view of the device of FIG. 1A, in which the feature has been filled by copper electroplating.

But successive reduction in feature sizes has meant that there is increasing difficulty in this process. When the seed layer is formed on the sidewalls as well as the bottom of the feature, the electroplating process deposits the metal on both surfaces within the feature. FIG. 1A shows the opening of the feature being "closed off" with seed layer deposition by PVD. With higher aspect ratio features, the electroplated metal growth on the wall tends to close off the feature at the aperture opening before the feature has been completely filled, resulting in a void 30 forming within the feature, as shown in FIG. 1B. The void changes the material and operating characteristics of the interconnect feature and may cause improper operation and premature breakdown of the device. Thus, with current processes, relatively thin copper seed layers are necessary to fill high aspect ratio features void-free.

The combined barrier and seed thickness that can be tolerated is projected to decrease from present day levels of 15–20 nm down to about 10 nm for future processes. As can be seen from Table 1, only copper (of the materials in the table) can be deposited at this thickness and still provide adequate conductivity in the field, assuming that a completely conformal layer is deposited. Also, the technology advances needed to coat such resistive films (even copper films) increase the cost of the equipment and process.

Thus, it has been difficult to electroplate copper films on semiconductor wafers with both good uniformity of thickness and good gap fill properties.

SUMMARY OF THE INVENTION

In accordance with the present invention, copper bus bars are formed between die on a semiconductor wafer. Features, such as trenches and vias, are etched in overlying dielectric layers. Contacts are etched along the bus bars to allow electrical conductance between the bus bars and the features on the die. A platable barrier or a thin copper seed layer allows current flow between the copper bus bars and the trenches and vias. The trenches and vias are then filled using conventional electroplating. The bus bars provide substantial current flow from the wafer edge to wafer center, so that the thin seed or platable barrier is relieved of the need to carry this current. This allows the sheet resistance of the platable barrier or seed layer to be much higher than with previous electrofill methods. Consequently, seed layers can be thinner with a thicker, more reliable barrier layer, and seed layers can be made from materials other than copper.

In one embodiment, the bus bar formation is integrated with the tungsten metallization step generally used at the first metallization level, to provide via contacts to the transistors. A dielectric layer is first deposited over the wafer and die, where the die have active elements formed thereon, such as transistors. The dielectric layer is then patterned and vias are etched to expose selected active elements on each die. Next, the dielectric layer and underlying silicon are etched to create deep intersecting trenches between adjacent die. Upon completion of the processing, the wafer is sawed along the trenches to separate the individual die. In one embodiment, the trenches are 50–100 μm wide and 2–5 μm deep, with a 15 mm pitch.

Thin conformal contact and barrier layers are deposited over the vias and trenches, e.g., 10 nm CVD Ti followed by 15 nm CVD titanium nitride. This is followed by a tungsten fill to create tungsten plugs in the vias. An ALD or CVD process can be used to deposit the tungsten. Next, a copper seed layer is deposited, such as a 150 nm thick layer by PVD, followed by a copper electroplating to fill the trenches, thereby forming a grid of conducting copper bus bars. Excess copper in the field is removed, such as by CMP, down to the tungsten layer. The tungsten and barrier layers are then removed to electrically isolate the copper bus bars from the adjacent die.

Another dielectric layer is then deposited over the wafer and die, and contacts and features, such as vias and trenches, are etched over the bus bars and die, respectively. The contacts will provide electrical conductance, via a subsequently deposited seed layer, from the bus bars to the die. In different embodiments, the contacts can be a continuous straight or serpentine trench or a series of trenches or via holes. A platable barrier or a stack consisting of a barrier and a thin copper seed, is deposited, such as by PVD. During electroplating, current is conducted primarily through the bus bars to each die from the wafer edge, and then through the platable barrier or seed layer to the features within the die. Electroplating then fills the vias or other features with copper.

For each succeeding level of metallization, a large number of vias, or other pattern such as trenches, is etched down until contact can be made to the bus bar.

Utilizing the bus bars, the voltage distribution on the wafer over large scales (e.g., several die) will be approximately the same as would be seen if the cross sectional area of the bus bar was replaced by a thin sheet of the same cross sectional area. However, in contrast to the thin film case, surface scattering effects will not appreciably increase the effective resistivity. A bus bar of 60 microns wide by 3 microns deep with a 15 mm pitch is equivalent to a sheet with a resistance of 1.6 ohms/sq. If made as a thin film, this would be equivalent to 18 nm of copper (accounting for surface scattering). So bus bars on this scale would be adequate to supply plating current to the wafer.

Further, the use of the grid of bus bars eliminates the requirement that the seed layer have a low resistance per square. The sheet resistance of the seed can be increased to take advantage of this overhead. For such resistive seeds, the current will be carried by the bus bars to the die edge and then through the seed layer only from the die edge. This allows seed layers made from materials other than copper. The barrier and seed layers could potentially be combined into a single layer. Alternatively, a resistive barrier layer could be used with a copper seed layer thinner than is possible without the bus bars, allowing the barrier to be made thicker and more reliable.

This invention will be more fully understood in light of the following detailed description taken together with the accompanying drawings.

BRIEF DESCRIPTION OF THE DRAWINGS

Use of the same reference numbers in different figures indicates similar or like elements.

DETAILED DESCRIPTION

Figure 2A:
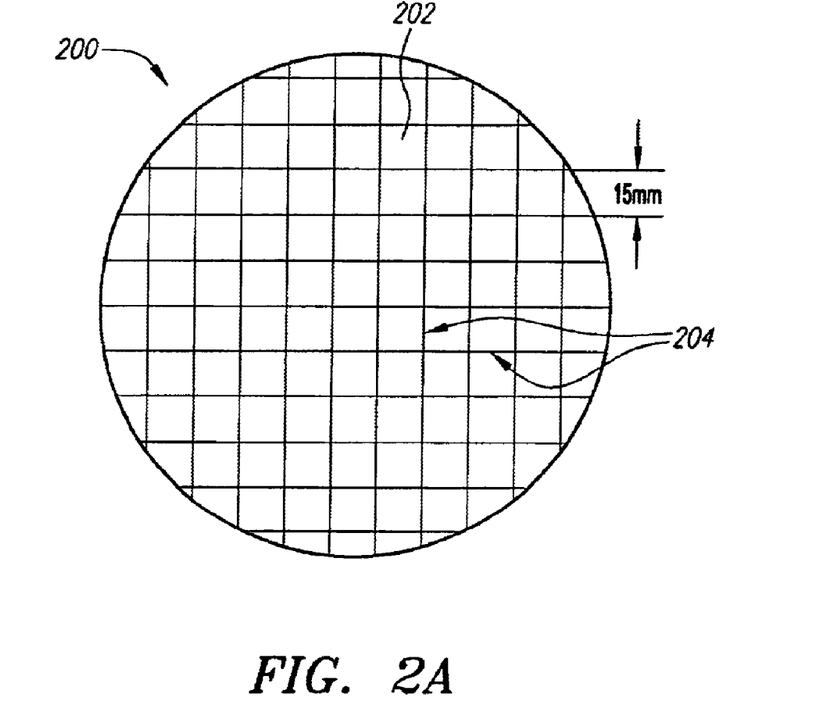
FIGS. 2A and 2B are a plan view and an isometric view, respectively, of a portion of a semiconductor wafer, die, and copper bus bars according to one embodiment.
Figure 2B:
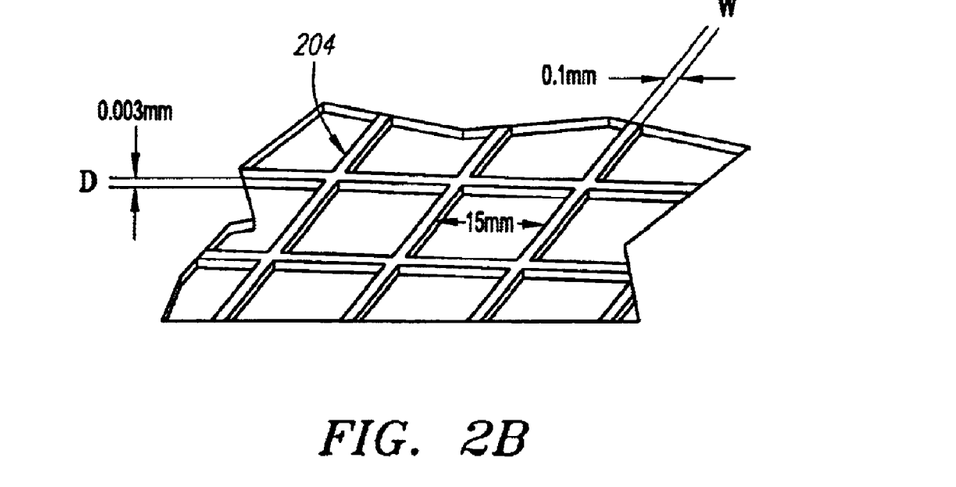

The present invention provides a process and structure that allows electroplating to fill sub-micron, high aspect ratio features using seed layers of lower sheet resistivity than with conventional electroplating techniques. Copper bus bars, provided between die on a semiconductor wafer, allow current to flow from a die edge to the die center during electroplating instead of requiring current to flow from the wafer edge inward. FIGS. 2A and 2B show a plan view and an isomeric view, respectively, of a portion of a semiconductor wafer 200, die 202, and copper bus bars 204. Note that the material between the bus bars have been removed for clarity. In one embodiment, the width W of the bus bar is 100 μm the depth D is 3 μm, with a 15 mm pitch (i.e., the die size is 15 mm×15 mm).

Figure 3:
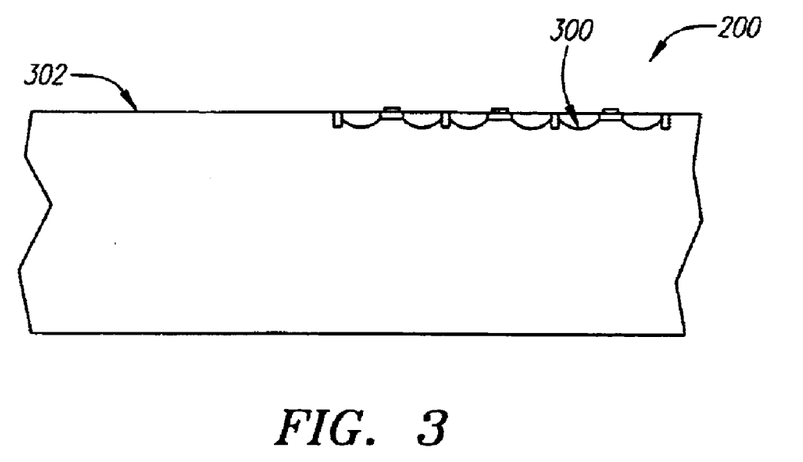
FIG. 3 is a cross-sectional view of a portion of a silicon wafer with transistors.
Figure 4:
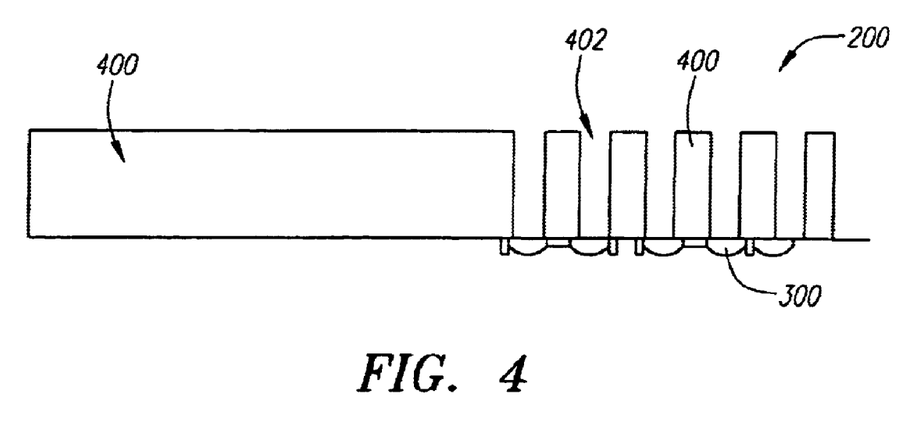
FIG. 4 is a cross-sectional view of the device of FIG. 3 with a dielectric layer deposited and vias etched.

FIGS. 3–11 show cross-sectional views of a portion of a semiconductor wafer during various stages of a process flow according to one embodiment of the invention. FIG. 3 shows a portion of silicon wafer 200, in which transistors 300 or other active regions have been formed using conventional methods. Portions 302 between the active regions separate individual to-be-formed die on the wafer. At this stage, a dielectric layer 400 is deposited and via holes 402 opened to the silicon, such as by a conventional etch process, as shown in FIG. 4. Dielectric layer 400 can be a silicon oxide or other suitable insulating material, with thickness ranging between 100 nm and 800 nm. In one embodiment, the thickness of dielectric layer 400 is 500 nm.

Figure 5:
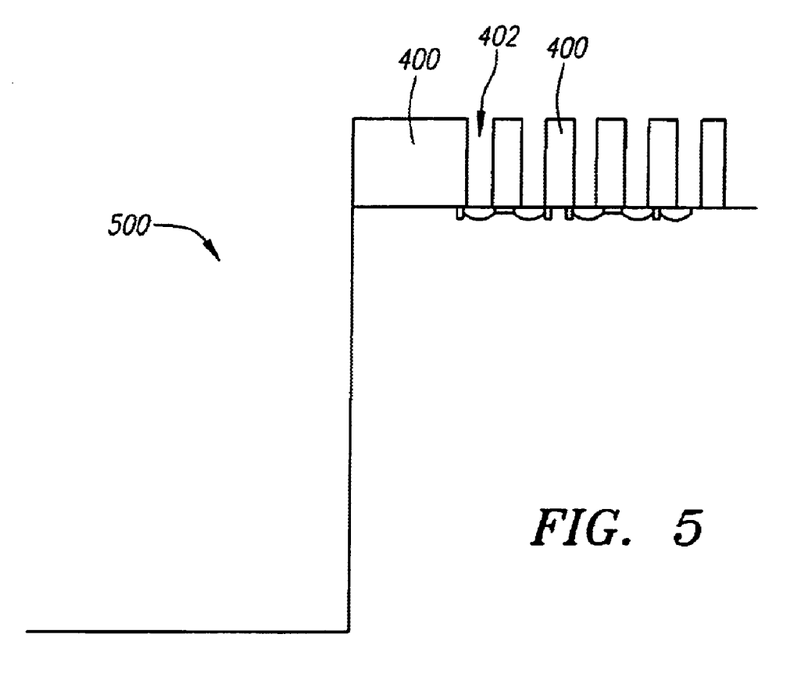
FIG. 5 is a cross-sectional view of the device of FIG. 4 with trenches etched in the dielectric layer and silicon.

Next, portions of dielectric layer 400 and underlying silicon of wafer 200 are patterned and etched to create an intersecting grid of trenches (see FIGS. 2A and 2B). Note that the trenches do not have to intersect, but can extend in parallel in either direction, e.g., horizontally or vertically. Trenches over the entire wafer can be patterned at once. One way is to use a photolithography process in which photoresist is deposited over the wafer, patterned (e.g., exposure through a mask), and developed. The exposed portions of the dielectric are then dry or wet etched to remove the dielectric and underlying silicon and form a grid of trenches in the silicon. Suitable dimensions for the trenches and eventual bus bars are 50–100 μm wide and 2–5 μm deep. In one embodiment, the trenches are 60 μm wide and 3 μm deep. Obviously the length varies depending on the size of the wafer and the location of the trench within the wafer. The trenches follow the paths along which the wafer will eventually be sawed into individual die. Part of such a trench 500 is shown in FIG. 5.

Figure 6:
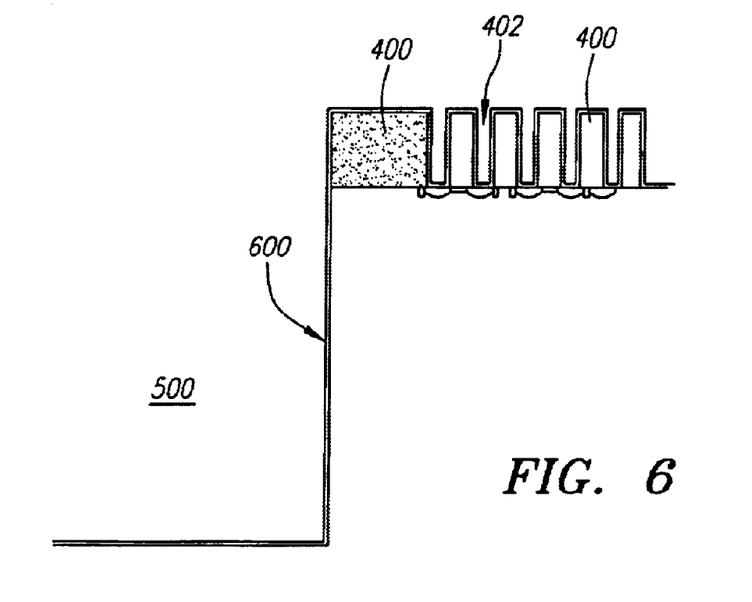
FIG. 6 is a cross-sectional view of the device of FIG. 5 with a barrier layer deposited.
Figure 7:
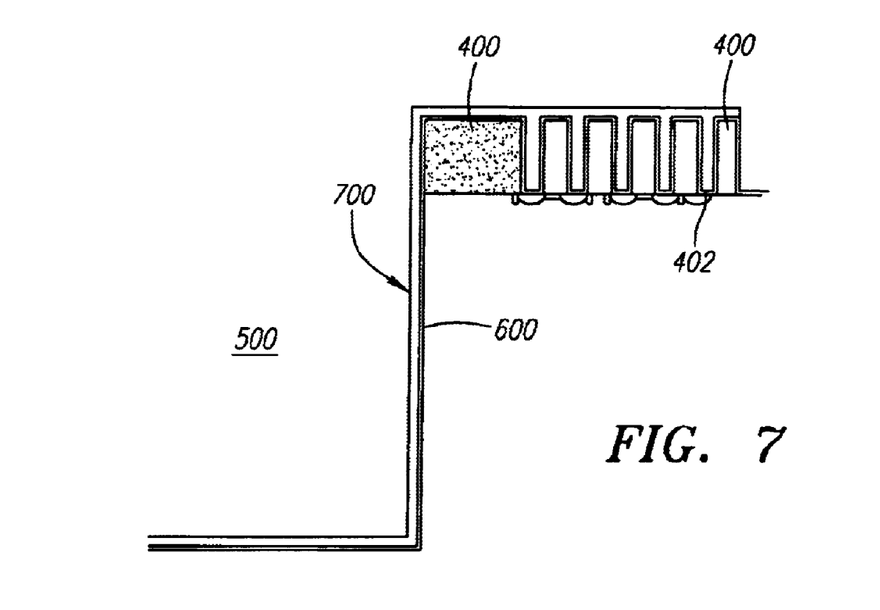
FIG. 7 is a cross-sectional view of the device of FIG. 6 with a tungsten layer deposited.

Next, wafer 200 is coated with a conformal barrier 600, such as a titanium nitride (TiN) barrier formed by CVD, as shown in FIG. 6. A contact layer composed of Ti is customarily deposited before the TiN barrier to improve contact to the transistors. In one embodiment, the Ti layer is 10 nm, and the TiN barrier is 15 nm. Other suitable deposition processes include PDL™ pulsed technology, in which successive pulses of precursors are used to build up a thin conformal film, and ionized PVD. In FIG. 7, tungsten (W) 700 is then deposited over barrier 600 and fill via holes 402, such as an ALD or CVD tungsten process. The thickness of the tungsten layer typically ranges between 50 nm and 300 nm. In one embodiment, the thickness is 250 nm. The tungsten in via holes 402 provide contact between the devices in the semiconductor substrate.

Figure 8:
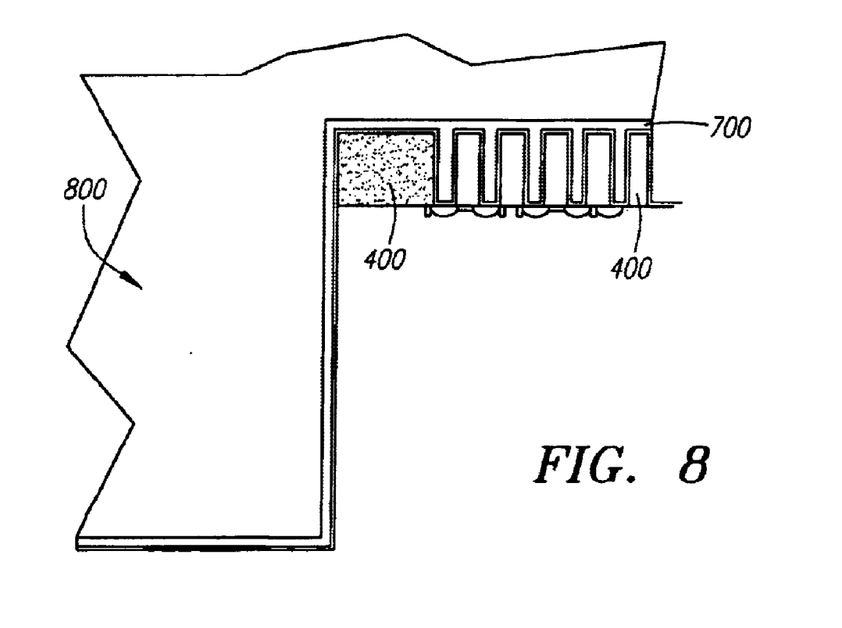
FIG. 8 is a cross-sectional view of the device of FIG. 7 with the trenched filled by copper electroplating.
Figure 9:
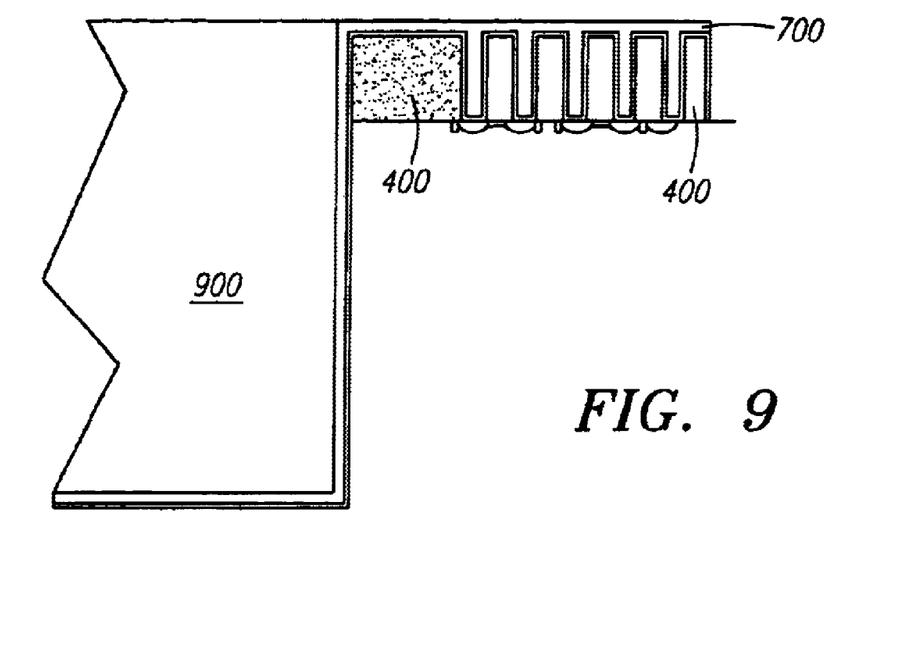
FIG. 9 is a cross-sectional view of the device of FIG. 8 with the excess copper removed to the tungsten layer.

A seed layer (not shown) is deposited over barrier 600. In one embodiment, a 150 nm copper seed layer is deposited by PVD from a conventional source, although other types of seed materials and deposition processes are also suitable. Other seed materials include metals, and in particularly, noble metals. Typical thickness of the seed layer range from 2 nm to 20 nm, with one embodiment being 6 nm. In FIG. 8, copper 800 has been electroplated to a thickness sufficient to fill trenches 500. Electroplating can be performed with conventional equipment and processes. Excess copper is then removed by a Cu CMP step or an electropolish module, as shown in FIG. 9. The layer of tungsten 700 acts as a CMP stop. Thus, enough copper is removed so that only trenches 500 are filled with copper 800, thereby forming copper "bus bars" 900 separating adjacent die on the wafer. Note that filling the feature is not limited to copper electroplating. Other suitable materials and/or process are Al by PVD followed by a CMP process for planarization and Ag.

Figure 10:
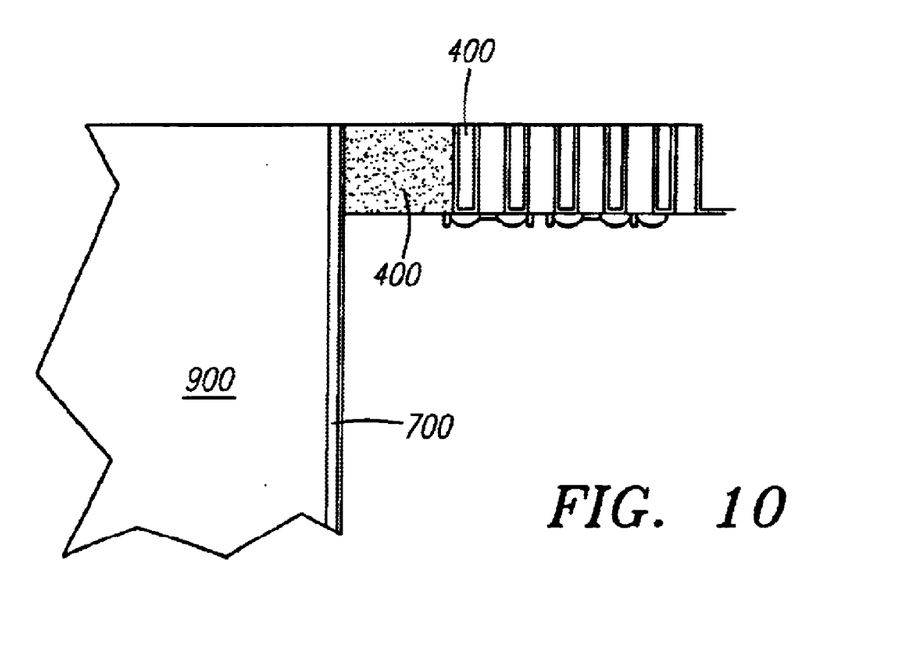
FIG. 10 is a cross-sectional view of the device of FIG. 9 with the tungsten and barrier layer removed.

Another CMP step (using a second slurry) is then used to remove the thin horizontal layers of tungsten 700 and titanium nitride barrier 600, as shown in FIG. 10. As seen in FIG. 10, copper bus bars 900 are separated from silicon 1000 by both a layer of tungsten 700 and a layer of titanium nitride barrier 600, which provide a high level of protection against copper diffusion into the silicon.

Figure 11:
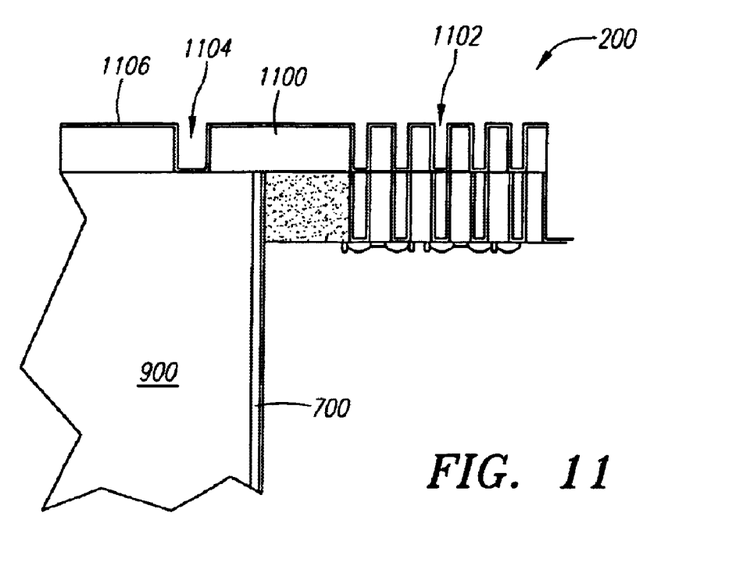
FIG. 11 is a cross-sectional view of the device of FIG. 10 with a dielectric layer deposited and etched to expose contacts and vias.

In FIG. 11, an insulating or dielectric layer 1100, such as a silicon oxide, has been deposited over wafer 200, e.g., by CVD. Note that dielectric layer 1100 can be deposited over a doped silicon substrate or other dielectric layers formed on the substrate. Dielectric layer 1100 is patterned, such as with a photolithographic process, and etched to form vias 1102, e.g., by plasma etching or other conventional etches. Vias 1102 contact the tungsten plugs, which, after filling, will provide electrical connection across the surface of dielectric layer 1100 to the underlying transistors. Note that other features can also be etched from the dielectric, such as contacts, lines, damascene and dual damascene structures having a via and a trench portion. Typical feature sizes are 250 nm with aspect ratios of approximately 4:1.

At each metallization level of the process flow, good electrical contact must be made to the copper bus bars. This is because the copper bus bars will provide current flow to the die when electroplating to fill subsequently formed features. Thus, as shown in FIG. 11, a contact 1104 is also etched in dielectric layer 1100 to expose the underlying copper of bus bars 900. The design of the contacts from a seed layer deposited in vias 1102 (or other features) to the bus bar is important. One objective is to provide the largest total perimeter of intersection of the etched pattern with the bus bars, since current will flow away from the bus bar through this perimeter. However, the open area of the contacts is not important. This allows relatively narrow features or contacts, e.g., 1–2 μm wide, to be defined. These features will be wide enough that there is no difficulty in coating their sidewalls, but narrow enough that bottom-up plating can occur, so that subsequent CMP is not difficult. The dimensions of the features will depend, in part, on the shape of the feature, as will described in more detail below.

One way of achieving this is by a dense pattern of vias or a trench as close as possible to the edge of the die, made as wide as is consistent with the lithographic and CMP dishing requirements. The trench may be made serpentine to further increase the perimeter. When the barrier and seed layers are deposited, they will coat the inside of the patterned structures and make contact to the bus bar, which will carry current from the perimeter.

Figure 12:
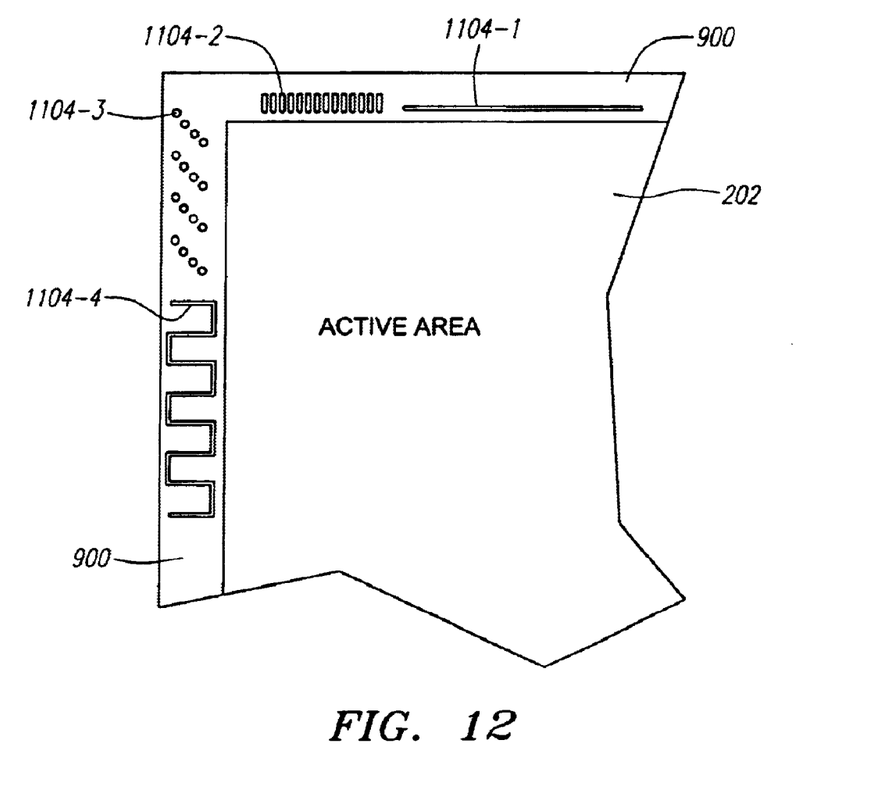
FIG. 12 is a top view of a portion of a die and bus bars showing different embodiments of contacts.

FIG. 12 shows a portion of die 202 and bus bars 900, along with four different embodiments of contact 1104 for contacting bus bar 900 to the seed layer in features of die 202. In one embodiment, a straight trench 1104-1 is etched along the length of bus bar 900 with a width of approximately 500 nm across, which allows for a 1:1 or lower aspect ratio. Other widths range from 200 nm to 4 μm. Straight trench 1104-1 does not have to be continuous; rather, there can be breaks between trenches. In one embodiment, the breaks are less than approximately 1% of the die size across, e.g., less than 150 μm.

In another embodiment, an array of elongated trenches 1104-2 whose long side is perpendicular to the bus bar is etched. In one embodiment, the array of trenches 1104-2 forms a single row of trenches, where the separation between adjacent trenches is 1 to 5, e.g., 2, times the width of the trench. The width of each trench is between 200 nm and 4 μm, with one embodiment being 500 nm. The length of each trench, in one embodiment, is approximately 20 to 50 μm if the width of bus bar 900 is approximately 100 μm. In a third embodiment, an array of circular vias 1104-3 are etched. In one embodiment, vias 1104-3 are approximately 500 nm in diameter, and the separation between adjacent vias is approximately 1 to 5 times the diameter, e.g., 500 nm to 2.5 μm. A fourth embodiment is a serpentine trench 1104-4 etched in the dielectric. In one embodiment, the trench is approximately 500 nm wide, and the serpentine is approximately 30 μm across (or high) with approximately 15 μm periodicity. The serpentine trench does not have to be continuous, but can have breaks or gaps, such as with straight trench 1104-1. Other shapes and patterns of contacts 1104 are also suitable, such that contacts 1104 do not significantly block current flow from the bus bar to the die.

In higher metallization levels, contact must be made to corresponding structures on the next layer below. Because of the relatively large size of the structures and the relatively low currents involved, this is not expected to be a major problem. Further, the current density in the bus bars or the barrier/seed layer is not sufficient to be a source of concern. Consider a future metallization stack 5 microns deep. The die size is 15 mm with a 300 mm wafer, and an initial plating current of 10 A is used. Thus, a current of about 31 mA/die is needed. Using a serpentine trench 1 μm wide around the die, the current density in the copper from the bus bar to the topmost seed layer is 25 A/cm$^2$, a very low level.

Referring back to FIG. 11, after contact 1104 and vias 1102 have been etched, electroplating of the wafer may now be carried out as usual. A conformal platable barrier 1106 is deposited over contact 1104 and vias 1102. Platable barrier 1106 can be a single barrier/seed layer formed continuously in the same tool or separate barrier and seed layers. Properties of platable barrier 1106 include being a metal that can be directly plated upon with good Cu adhesion and one that prevents Cu atom diffusion into adjacent layers. Deposition is typically performed by CVD. Barrier/seed layers or stacks are known, and some suitable barrier/seed materials include Co, Ru, Re, Pt, and Pd. Stacks include Cu over TiN, Cu over TaN, and Cu over a TaN/Ta bi-layer. Combined thicknesses are in the range of 2 nm to 50 nm, and in one embodiment, 10 nm. Because the copper bus bars will carry current from the wafer edge to its center and also from a die edge to its center, a seed layer only has to conduct current from the die edge to its center and no longer has to conduct current over the entire wafer. With conventional electroplating of copper, electrical contacts are made between the seed layer and a cathode to attract positively charged copper ions to and electrochemically plate onto the seed layer of the wafer.

The contacts are preferably positioned at the perimeter of the wafer to reduce the amount of unusable area of the wafer. This perimeter position of the contacts results in a radially variable IR drop in the seed layer, i.e., the voltage and current are high at the perimeter of the wafer and decrease toward the inner portions. Consequently, the uniformity of the thickness of the electroplated film is difficult to control and the quality is generally poor.

However, because of the existence of this grid of conductors, the seed layer can have much higher sheet resisitivities than with conventional electroplating techniques, while still maintaining an equipotential surface across the wafer. For example, with a 300 mm wafer containing 15 mm square die and an initial 10 A plating current, there is a voltage drop of about (0.0024)*Rsq volts from the center of the die to the edge. If a drop of 50 mV can be tolerated, the seed layer can have a sheet resistance of 21 ohms/square. This corresponds to, e.g., seed layers of about 10 nm of CVD tungsten or cobalt, or about 2–3 nm of Cu when surface scattering is allowed for. Thus, seed layers other than copper can be used. Such bus bars provide contact to the wafer edge equivalent to a continuous seed layer of well below 5 ohms/square. Further, a resistive barrier layer could be used with a copper seed thinner than is possible without the bus bars, allowing the barrier to be made thicker and more reliable. With thinner barrier/seed layers, higher aspect ratio features, e.g., 10:1, can be filled void-free.

After electroplating copper to fill vias 1102 and contact 1106, the top portion of the processed substrate, i.e., the exposed electroplated copper layer is then planarized, preferably by CMP. During the planarization process, portions of the copper layer, copper seed layer, barrier layer, and a top surface of the dielectric layer are removed from the top surface of the substrate, leaving a fully planar surface with conductive interconnect features.

The above-described embodiments of the present invention are merely meant to be illustrative and not limiting. It will thus be obvious to those skilled in the art that various changes and modifications may be made without departing from this invention in its broader aspects. For example, the above embodiments describe a sequence of process steps, such as etching vias and etching trenches. Various steps can be combined into a single step, such as using a single photolithography step to pattern and etch both the vias and trenches. Further, different embodiments are shown for the contacts to the bus bars; however, other types of patterns and shapes are also suitable. The above embodiments also show the trenches and bus bars forming an intersecting grid. Advantages of the present invention can also be achieved with non-intersecting parallel bus bars. Therefore, the appended claims encompass all such changes and modifications as fall within the true spirit and scope of this invention.

I claim:

1. A method of processing a semiconductor wafer, comprising:

forming wide trenches between die on the wafer;

filling the trenches with a first conductive material;

depositing a dielectric layer over the die and the filled trenches;

etching portions of the dielectric layer over the filled trenches and the die to form contacts and features, respectively;

depositing a seed layer over the contacts and features, wherein the seed layer provides a conductive path between the filled trenches and the features; and filling the contacts and the features with a second conductive material.

2. The method of claim 1, wherein the trenches are perpendicular to each other.

3. The method of claim 1, wherein the trenches extend to the edge of the wafer.

4. The method of claim 1, wherein the width of the trenches is between 50 and 100 $\mu$m and the depth is between 2 and 5 $\mu$m.

5. The method of claim 1, wherein the first and second conductive material is copper.

6. The method of claim 1, further comprising after forming the trenches:

depositing a barrier layer over the wafer; and depositing a tungsten layer over the barrier layer.

7. The method of claim 6, wherein the barrier layer comprises titanium nitride.

8. The method of claim 1, further comprising, prior to forming trenches:

depositing a second dielectric layer over the wafer; and etching vias over active areas of the die.

9. The method of claim 8, wherein forming the trenches comprises etching the second dielectric layer and portions of silicon from the wafer.

10. The method of claim 6, further comprising, prior to forming trenches:

depositing a second dielectric layer over the wafer, and etching vias over active areas of the die.

11. The method of claim 10, further comprising, after forming the trenches:

etching excess first conductive material; and etching portions of the barrier layer and tungsten layer overlying the die.

12. The method of claim 1, wherein filling the contacts and features is by electroplating, and wherein the second conductive material is copper.

13. The method of claim 1, further comprising depositing a barrier layer, wherein the seed layer overlies the barrier layer.

14. The method of claim 13, wherein the seed layer and the barrier layer comprise a single layer.

15. The method of claim 1, wherein the seed layer contains no copper.

16. The method of claim 1, wherein the seed layer comprises copper and is less than 10 nm thick.

17. The method of claim 1, wherein forming the contacts comprises etching a serpentine trench in the dielectric layer.

18. The method of claim 1, wherein forming the contacts comprises etching a straight trench in the dielectric layer.

19. The method of claim 1, wherein forming the contacts comprises etching an array of trenches in the dielectric layer.

20. The method of claim 1, wherein forming the contacts comprises etching an array of vias in the dielectric layer.

21. The method of claim 1, further comprising sawing the wafer along the filled trenches.

22. The method of claim 6, wherein the first conductive material is separated from the substrate along the bottom of the trenches by the barrier layer and the tungsten layer.

23. A method of processing a semiconductor wafer, the wafer comprising a plurality of die, the method comprising:

depositing a dielectric layer over the wafer;

forming openings in the dielectric layer over selected active elements of the die;

forming trenches between the die on the wafer;

depositing a barrier layer over the wafer;

depositing a conductive material over the wafer to fill the openings and line the trenches;

filling the trenches with copper, wherein the barrier layer and the conductive material is between the copper and the dielectric layer along the bottom of the trenches;

insulating the trenches from the die;

depositing a second dielectric layer over the wafer;

forming contacts over the trenches and features over the die;

forming a conductive path between the trenches and the die; and filling the contacts and features by electroplating.

24. The method of claim 23, wherein the trenches are perpendicular to each other.

25. The method of claim 23, wherein the trenches extend to the edge of the wafer.

26. The method of claim 23, wherein the width of the trenches is between 50 and 100 $\mu$m and the depth is between 2 and 5 $\mu$m.

27. The method of claim 23, further comprising sawing the wafer along the filled trenches.

* * * * *